(12) United States Patent
Kaminaga et al.

(10) Patent No.: US 8,304,847 B2
(45) Date of Patent: Nov. 6, 2012

(54) SEMICONDUCTOR PRESSURE SENSOR

(75) Inventors: Toshiaki Kaminaga, Hitachinaka (JP);
Masahide Hayashi, Tokyo (JP);
Katsumichi Ueyanagi, Matsumoto (JP);
Kazunori Saito, Matsumoto (JP);
Mutsuo Nishikawa, Matsumoto (JP)

(73) Assignee: Fuji Electric Co., Ltd., Kawasaki (JP)

( * ) Notice: Subject to any disclaimer, the term of this patent is extended or adjusted under 35 U.S.C. 154(b) by 180 days.

(21) Appl. No.: 12/092,226

(22) PCT Filed: Nov. 1, 2005

(86) PCT No.: PCT/JP2005/020072
§ 371 (c)(1),
(2), (4) Date: Aug. 8, 2008

(87) PCT Pub. No.: WO2007/052335
PCT Pub. Date: May 10, 2007

(65) Prior Publication Data
US 2009/0218643 A1  Sep. 3, 2009

(51) Int. Cl.
*H01L 29/02* (2006.01)

(52) U.S. Cl. ............... 257/417; 257/E29.141; 438/617; 73/754; 73/756

(58) Field of Classification Search .............. 257/417, 257/E29.141, 415, 418, 419, 420; 438/617, 438/612, 613, 614, 52; 73/754, 756; 347/50
See application file for complete search history.

(56) References Cited

U.S. PATENT DOCUMENTS

| 5,942,448 | A |   | 8/1999 | White |
| 6,107,170 | A | * | 8/2000 | Sathe et al. ............. 438/583 |
| 6,450,617 | B1 | * | 9/2002 | Kitani et al. ............. 347/50 |
| 6,798,050 | B1 |   | 9/2004 | Homma et al. |
| 7,030,496 | B2 |   | 4/2006 | Shinyama et al. |
| 2005/0001316 | A1 | * | 1/2005 | Dean et al. ............. 257/750 |
| 2005/0034526 | A1 | * | 2/2005 | Shinyama et al. ............. 73/715 |
| 2005/0210993 | A1 |   | 9/2005 | Toyoda et al. |

FOREIGN PATENT DOCUMENTS

| EP | 0 567 937 A2 | 11/1993 |
| EP | 1 577 936 A1 | 9/2005 |
| JP | 9-250962 A | 9/1997 |
| JP | 10-153508 A | 6/1998 |
| JP | 2005-33131 A | 2/2005 |
| KR | 0454381 | 5/2001 |
| KR | 0646820 | 1/2005 |
| WO | WO 2004/059722 A1 | 7/2004 |

OTHER PUBLICATIONS

Written Opinion of the International Searching Authority dated Nov. 29, 2005, with an English translation of the pertinent portions (Nine (9) pages). Supplementary European Search Report (seven (7) pages).
International Search Report dated Nov. 29, 2005 (Form PCT/ISA/210) with English translation of relevant portion (Three (3) pages).
Japanese Office Action with partial English translation dated Sep. 6, 2011 (eight (8) pages).
Korean Office Action dated Nov. 30, 2010 with partial English translation (eight (8) pages).

* cited by examiner

*Primary Examiner* — Minh-Loan T Tran
*Assistant Examiner* — Fazli Erdem
(74) *Attorney, Agent, or Firm* — Crowell & Moring LLP

(57) ABSTRACT

An object of the present invention is to solve problems in that aluminum electrodes, aluminum wires, and I/O terminals are corroded by corrosive gasses when a pressure of a pressure medium containing corrosive matters such as exhaust gas is measured with a semiconductor sensor; and improve not only the corrosion resistance of the sensor chip but also the corrosion resistance of the portion particularly functioning as the pressure receiver.
Each of the aluminum electrodes that is likely to be corroded portions is prevented from being corroded by forming a titanium-tungsten layer and gold layer on the aluminum electrode. The connecting wires are prevented from being corroded by corrosive matters by using gold wires. The I/O terminals are also prevented from being corroded by applying gold plating.

11 Claims, 4 Drawing Sheets

SEMICONDUCTOR PRESSURE SENSOR

TECHNICAL FIELD

The present invention relates to a mounting structure for a semiconductor pressure sensor that uses semiconductor strain gages to improve corrosion resistance to corrosive gases.

BACKGROUND ART

A semiconductor pressure sensor using semiconductor a strain gage has been used for measurement of an intake air pressure in an automobile and others. In recent years, with the aim of improving cleanliness exhaust gas, the adoption of EGR for recirculating exhaust gas to an intake air system has been spread and a recirculation rate of EGR tends to increase particularly in an application to a diesel engine. Since a semiconductor pressure sensor for pressure measurement on the intake air system with EGR has been used in an environment where the semiconductor pressure sensor is more likely to be exposed in exhaust gas, the necessity of resistance to exhaust gas is increasing.

Further, in the case of a diesel engine, the adoption of a DPF (Diesel Particulate Filter) is under way in order to reduce particulate matters (PMs) and there is a need to sense pressures on both of upstream from and downstream from the filter in order to detect clogging of the filter. On this occasion, a pressure sensitive element of a pressure sensor for use the clogging detection is required to have resistance to exhaust gas.

In the case of a conventional semiconductor pressure sensor, as shown in FIG. 3 of Patent Document 1 (JP-A No. 153508/1998), aluminum is generally used for an electrode chip of a semiconductor strain gage. An aluminum electrode is susceptible to corrosion and a measure against the corrosion is necessary when it is used in a corrosive environment.

In Patent Document 1, a Ti coating film and a Pd coating film are used as a measure for preventing the corrosion of the aluminum electrode. Such a measure is particularly aimed at improving corrosion resistance of the aluminum electrode against humidity and moisture. However the measure is still insufficient for the resistance of corrosion caused by nitrate ions in nitrogen oxide contained in exhaust gas.

Patent Document 1: JP-A No. 153508/1998

DISCLOSURE OF THE INVENTION

Problem to be Solved by the Invention

A conventional semiconductor pressure sensor uses aluminum electrodes at bonding pads functioning as electrical input and output terminals of a semiconductor strain gage chip, external input and output terminals (usually nickel-plated terminals) to input and output signals of the gage, and aluminum wires to connect the aluminum electrodes to the external input and output terminals respectively by bonding. A problem of such a mounting structure for these elements of the semiconductor pressure sensor is that, when it is used in an environment containing exhaust gas for a long period of time, the aluminum wire may be corroded by nitrate ions produced from nitrogen oxide contained in the exhaust gas.

An object of the present invention is, in view of the above problem in the conventional technology, to provide a semiconductor pressure sensor having a sufficiently high corrosion resistance even in an exhaust gas environment. Other objects of the present invention will be elaborated in the explanations on the following embodiments.

Means for Solving the Problem

The present invention to attain the above objects is a pressure sensor to measure a pressure of a gas containing corrosive components such as exhaust gas and is characterized in that: the whole area of a semiconductor chip, except for pads for wire bonding and probe pads for characteristic confirmatory check which function as electrical input and output portions, is coated with a corrosion-resistant material such as silicon nitride (SiN); an adhesion ensuring-diffusion preventative layer is formed on aluminum electrodes at the pads for wire bonding and the probe pads for characteristic confirmatory check; and the surface of the adhesion ensuring-diffusion preventative layer is coated with gold.

The adhesion ensuring-diffusion preventative layer is, for example, formed by sputtering, vapor deposition, or plating of titanium-tungsten (TiW), titanium nitride (TiN), or nickel (Ni).

The adhesion ensuring-diffusion preventative layer has, for example, a thickness of about 0.25 μm and is configured so as to overhang the silicon nitride.

Further, the electrical input and output portions of the semiconductor chip are, for example, connected to the external input and output terminals with gold wires respectively and the surfaces of the external input and output terminals are coated with gold. The thickness of the gold coating is, for example, not less than 0.5 μm.

Further, the semiconductor chip is, for example, bonded to glass with anodic bonding and the temperature in the anodic bonding is not higher than 320° C.

The surface of the adhesion ensuring-diffusion preventative layer is, for example, formed at the pads for wire bonding and the probe pads for characteristic confirmatory check are coated with gold after the semiconductor chip bonded to glass with anodic bonding.

Further, the semiconductor pressure sensor is, for example, configured so that parts of aluminum of the lower portions of the aluminum electrodes to which wire bonding is applied may be cut out in order to prevent the adhesion ensuring-diffusion preventative layer from being damaged due to the application of vibration at the gold coating.

Advantages of the Invention

According to the present invention, the pads for wire bonding and the probe pads for characteristic confirmatory check are provided with the adhesion ensuring-diffusion preventive layer in an aluminum wiring layout and hence the gold coating applied on the outermost surface of the pads is prevented from diffusing into the aluminum electrodes. Further, since the electrical input and output portions of the semiconductor chip are connected to the exterior input and output terminals with the gold wires and the gold has the smallest ionization tendency in metallic elements, it is possible to prevent corrosion caused by corrosive matters.

BRIEF DESCRIPTION OF THE DRAWINGS

FIG. 4 shows a structure of a differential pressure sensor to which two pressure sensor submodules according to the present invention are applied, in which

EXPLANATIONS OF REFERENCE NUMERALS

Figure 1A:
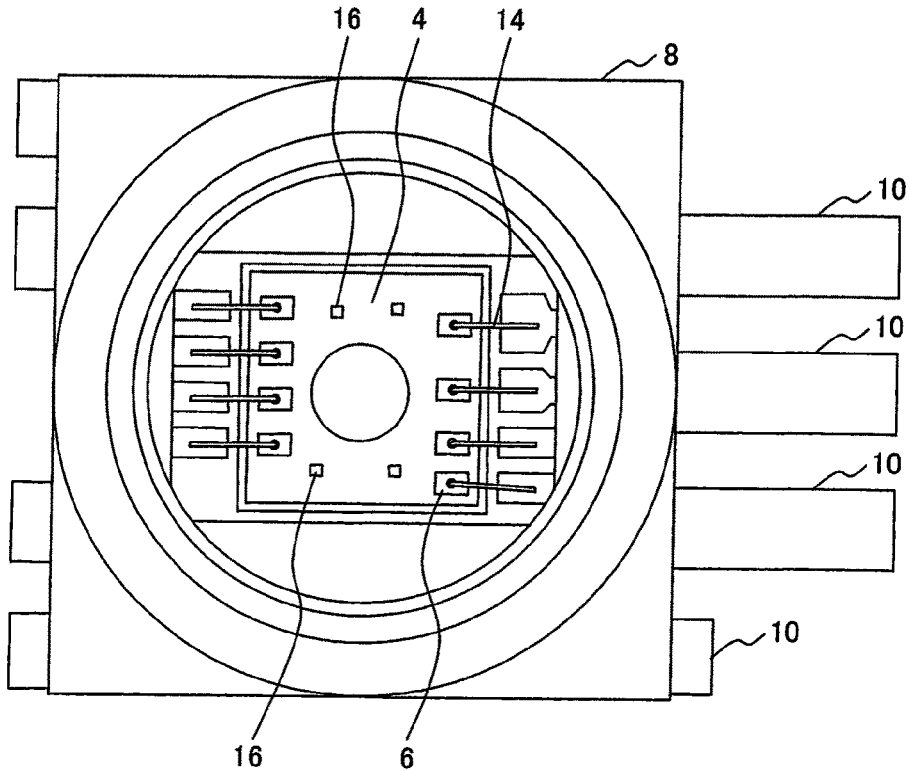
FIG. 1 shows a front view and a sectional view showing a pressure sensor submodule according to a first embodiment of the present invention.

1: Diaphragm, 2: Sensor chip, 3: Aluminum electrode, 4: Silicon nitride, 5: Adhesion ensuring-diffusion preventative layer (titanium-tungsten layer), 6: Gold electrode, 7: Glass substrate, 8: Case, 9: Adhesive agent, 10: Terminal, 11: Base material, 12: Nickel-plated layer, 13: Gold-plated layer, 14: Gold wire, 15: Gel, 16: Probe pad for characteristic confirmatory check, 20: Submodule, 21: Connector, 22: Pressure inlet, 23: Housing, 24: Connector terminal, 25: Epoxy resin, 31, 32: Pressure inlet, 33: Circuit board

BEST MODE FOR CARRYING OUT THE INVENTION

In a preferable embodiment according to the present invention, firstly the whole area of a semiconductor chip, except for pads for wire bonding and probe pads for characteristic confirmatory check which are functions as electrical input and output portions, is coated with a corrosion-resistant material such as silicon nitride (SiN). The pads for wire bonding and the probe pads for characteristic confirmatory check are provided with the adhesion ensuring-diffusion preventive layer in an aluminum wiring layout. The outermost surface of the layer is coated with gold.

The adhesion ensuring-diffusion preventative layer in the aluminum wiring layout is formed by sputtering, vapor deposition, or plating of titanium-tungsten (TiW), titanium nitride (TiN), or nickel(Ni). By so doing, it is possible to prevent gold coating applied to the outermost surfaces of the layer from diffusing into the aluminum electrodes.

Further, electrical input and output portions of the semiconductor chip are connected to external input and output terminals for the electrical I/O of the semiconductor chip with gold wires and the surfaces of the external input and output terminals are coated with gold by plating or the like.

The gold coating on the outermost surfaces of the pads for wire bonding and the probe pads for characteristic confirmatory check as electrical I/O portions on the surface of the semiconductor chip is formed by sputtering, plating, or both sputtering and plating. The thickness of the gold coating is not less than 0.5 micrometer and thereby the corrosion resistance is ensured.

When a semiconductor strain gage is mounted as a semiconductor pressure sensor, the semiconductor chip is required to have good handleability. Further, in the case of an absolute pressure sensor, the semiconductor chip is bonded to a glass substrate with anodic bonding in order to form a vacuum chamber. When gold coating is applied before the anodic bonding, the temperature at the anodic bonding is 320° C. or lower. If bonding is applied at a temperature higher than 320° C., cracks may be formed in the adhesion ensuring-diffusion preventative layer because of the difference in linear expansion coefficient among the aluminum electrodes, the adhesion ensuring-diffusion preventative layer, and the gold-coated layers, and accordingly gold may diffuse into aluminum.

Further, after the semiconductor chip bonded to glass in advance, the adhesion ensuring-diffusion preventative layer is formed on the pads for wire bonding and the probe pads for characteristic confirmatory check as the electrical I/O portions on the semiconductor chip surface and gold coating is applied. By so doing, cracks are prevented from occurring in the adhesion ensuring-diffusion preventing layer due to the heating during the anodic bonding.

Further, by locally cutting out a part of aluminum electrodes to which wire bonding is applied, it is possible to prevent the adhesion ensuring-diffusion preventative layer from being damaged by vibration caused by the application of load at the gold wire bonding.

In the preferable embodiment according to the present invention, adhesion ensuring-diffusion preventative layer is formed on the pads for wire bonding and probe pads for characteristic confirmation in aluminum wire layout and hence the gold coating applied on the outermost surfaces of the layer is prevented from diffusing into the aluminum electrodes. If the layer are not formed, gold diffuses into aluminum and improvement in the corrosion resistance of the connected electrodes can not be ensured by gold coating.

Further, the electrical input and output portions in the semiconductor chip are connected to the external input and output terminals with gold wires. By so doing, it is possible to prevent corrosion caused by corrosive matters since the gold has the smallest ionization tendency in metallic elements.

The gold coating on the outermost surfaces of the pads for wire bonding and the probe pads for characteristic confirmatory check can be formed by sputtering, plating, or both sputtering and plating and thus can be formed in a usually used process for forming a gold bump in a semiconductor. The corrosion resistance is secured by setting the thickness of the gold-coated layer at not less than 5 micrometer. When the thickness is less than 5 micrometer, corrosion proceeds due to corrosive matters and an intended service life cannot be obtained.

In the case where the semiconductor pressure sensor is an absolute pressure sensor, the temperature at which the semiconductor chip is anodically bonded to the glass substrate in order to form a vacuum chamber is 320° C. or lower. If bonding is applied at a temperature higher than 320° C., cracks are formed in the adhesion ensuring-diffusion preventative layer because of the difference in linear expansion coefficient among these layers, gold diffuses into aluminum, and the surfaces of the electrodes cannot be coated with gold. Consequently, not only corrosion resistance cannot be secured but also gold wire bonding cannot be applied.

Further, by forming the adhesion ensuring-diffusion preventive layer at the pads for wire bonding and the probe pads and applying gold coating after the semiconductor chip is anodically bonded to the glass substrate, the cracks are prevented from occurring in the adhesion ensuring-diffusion preventative layer due to the heating at the anodic bonding and gold is prevented from diffusing into the aluminum electrodes. By so doing, the corrosion resistance of the gold-coated electrodes is ensured.

Furthermore, since the part of aluminum electrodes to which wire bonding is applied is locally cut out, the adhesion ensuring-diffusion preventing layer is prevented from being damaged by vibration caused by the application of load at the gold wire bonding and gold is prevented from diffusing into the aluminum electrodes.

Embodiments according to the present invention are hereunder explained in detail in reference to drawings.

First Embodiment

Figure 1B:
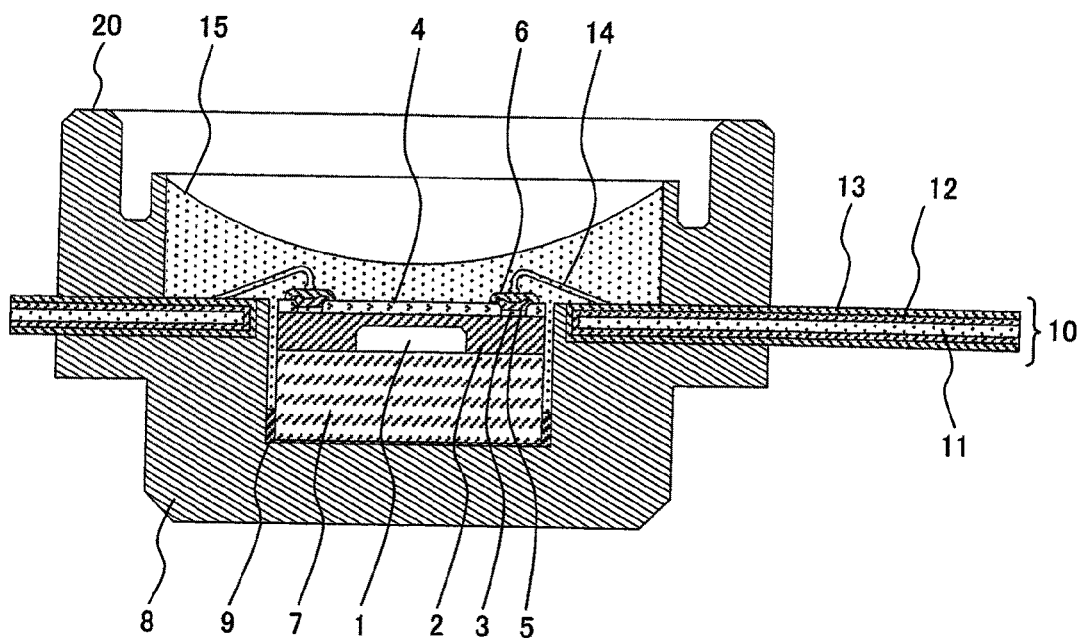

FIG. 1 comprises a front view (FIG. 1(A)) and a sectional view (FIG. 1(B)) showing a semiconductor pressure sensor submodule according to the first embodiment of the present invention. The present embodiment is the case where a pressure sensitive element of the pressure sensor is formed with a small submodule.

A diaphragm 1 made of silicon and provided with resistances (not shown in the figure) functioning as a strain gage are formed in a sensor chip 2. The strain gage-resistances and aluminum electrodes 3 to connect them are formed on the surface of the sensor chip 2. Further, the sensor chip 2 is covered with silicon nitride (SiN) 4 in order to protect the strain gage-resistances and the aluminum electrodes against a corrosive environment.

At wire bonding pads for outputting a signal from the strain gage, the aluminum electrodes are exposed usually and the signal are output to the exterior through aluminum wires or gold wires.

Each of wire bonding pads according to the present embodiment is configured by forming an adhesion ensuring-diffusion preventative layer (hereunder referred to as a titanium-tungsten layer) 5 made of titanium-tungsten (TiW) on an aluminum electrode 3, and furthermore forming a gold electrode 6 thereon by gold plating. The thickness of the gold-plated layer is not less than 0.5 μm.

As the adhesion ensuring-diffusion preventative layer, besides titanium-tungsten (TiW), titanium nitride (TiN) or nickel (Ni) can be used. Further, the adhesion ensuring-diffusion preventative layer can be formed, besides by sputtering, by vapor deposition or plating. Thus, it is possible to prevent corrosion caused by corrosive components such as nitric acid produced from nitrogen oxide (NOx) and water when the semiconductor pressure sensor submodule is used in such an environment as exhaust gas.

Likewise, each of probe pads for characteristic confirmatory check is configured by forming a titanium-tungsten layer 5 on an aluminum electrode and forming a gold electrode thereon by gold plating; and confirms characteristics by probing with the gold electrode. Thus, it is possible to prevent corrosion by corrosive components when the semiconductor pressure sensor submodule is used in such an environment as exhaust gas in comparison with the conventional case where an aluminum electrode is exposed.

The sensor chip 2 is mounted on a glass substrate 7 by anodic bonding. When the titanium-tungsten layer 5 and the gold electrode 6 are formed on the sensor chip 2 in advance and thereafter the glass substrate 7 is bonded to the sensor chip 2 by anodic bonding, the anodic bonding is applied at a high temperature.

According to studies by the present inventors, the phenomena observed when anodic bonding is applied at a high temperature of 320° C. or higher are that: cracks occur in the titanium-tungsten layer 5; gold in the gold electrode 6 diffuses into the aluminum electrode 3; and the gold protective layer disappears. To cope with the phenomena, it is necessary to apply anodic bonding at a temperature not exceeding 320° C.

The sensor chip 2 is mounted on the glass substrate 7 and the glass substrate 7 is bonded to a case 8 of the submodule with an adhesive agent 9. Terminals 10 for inputting and outputting signals from the submodule to the exterior are provided in the case 8 by insert molding. The terminals 10 are formed by coating a base material 11 with a nickel plated layer 12 and thereafter with a gold plated layer 13. The terminals' portions connected to the sensor chip 2 are exposed to a corrosive environment in the same way as the sensor chip 2 and hence the corrosion resistance is enhanced with the gold plated layer 13.

After the bonding with the gold wires 14, fluorine-type gel 15 is provided in the case 8 to cover the sensor chip 2 and the gold wires 14 in the present embodiment. The whole upper surface of the gel 15 is used as a pressure receiving portion.

Figure 2:
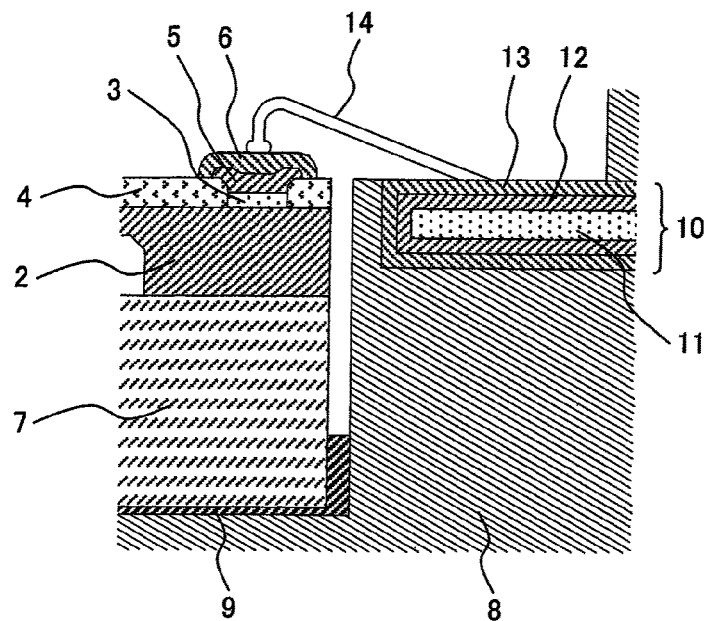
FIG. 2 shows an enlarged sectional view showing a substantial part of the pressure sensor submodule shown in FIG. 1.

FIG. 2 is an enlarged sectional view showing a substantial part of the pressure sensor submodule shown in FIG. 1. The titanium-tungsten layer 5 is formed on an aluminum electrode 3 so as to overhang the silicon nitride 4 by sputtering or the like. The thickness of the titanium-tungsten layer 5 is about 0.25 μm. It is intended so that corrosive matters may hardly reach the aluminum electrode 3 through the interface between the silicon nitride 4 and the titanium-tungsten layer 5. Further, gold plating is applied on the titanium-tungsten layer 5 and thus a gold electrode 6 covered entirely with gold is formed.

The whole surface of each of the terminals 10 is coated with a nickel-plated layer 12 and thereafter a gold-plated layer 13. By this configuration, it is possible to improve corrosion resistance even when corrosive matters touch connecting portions for the terminals since the whole portions where electrical drawbacks may occur due to corrosion are covered with gold having the smallest ionization tendency.

Figure 3:
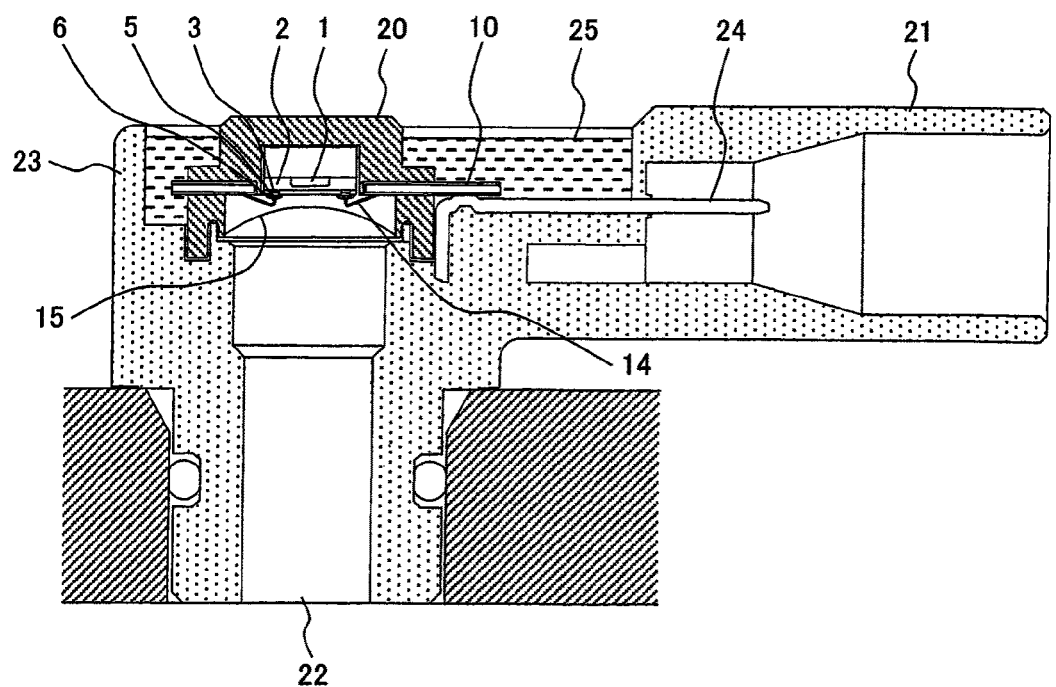
FIG. 3 shows a sectional view of a pressure sensor when the pressure sensor submodule shown in FIG. 1 is mounted on a housing.

FIG. 3 is a sectional view showing a pressure sensor when a pressure sensor submodule is mounted on a housing. The pressure sensor submodule 20 shown in FIG. 1 is mounted to a housing 23 with a connector 21 for electrical I/O to the exterior, a pressure inlet 22 to introduce the pressure of a measured pressure medium.

In the present embodiment, each of terminals 10 of the submodule 20 is connected to a connector terminal 24 by welding. Further, the submodule 20 is fixed with epoxy resin 25 and the epoxy resin 25 has also the function as a sealant to prevent leakage of pressure or the like from the pressure inlet 22.

Exhaust gas or the like as a measured medium reaches the interior of the sensor through the pressure inlet 22 and the pressure deforms a diaphragm 1 of the sensor chip 2 through the gel 15. The deformation of the diaphragm 1 causes the pressure to convert into an electric signal due to the resistance change of strain gages (not shown in the figure) attached to the diaphragm 1 and the electric signal is transferred to the exterior through the bonding wires 14, the terminals 10, and the connectors 24.

The exhaust gas intruding through the pressure inlet 22 diffuses also into the gel 15 and reaches the gage chip 2. On this occasion, corrosive matters are prevented from reaching underneath layers of the gage chip by covering the parts with the silicon nitride 4 which is coated over the whole of gage chip except for the electrical I/O portions. At the electrical I/O portions, the titanium-tungsten layers 5 and the gold electrodes 6 are applied on the aluminum electrodes 3 as stated above. Thus the electrodes are prevented from corroding due to corrosive matters. The bonding wires through which signals from the electrodes 3 are input and output are also prevented from corroding by using the gold wires 14. Further, by forming the titanium-tungsten layer 5 having a thickness of about 0.25 μm so as to overhang the silicon nitride 4 as shown in FIG. 2, such diffusion of exhaust gas intruding into the aluminum electrodes 3 from an interface between the silicon nitride 4 and the gold electrodes 6 is suppressed. Furthermore, each of the terminals is also prevented from corroding by applying the gold-plated layers 13 on the surfaces of the submodule terminals 11.

By configuring such a mounting structure, it is possible to prevent the sensor from being damaged by corrosion when the pressure of a measured medium containing corrosive matters such as exhaust gas is measured.

FIG. 4 shows a structure of a differential pressure sensor that is an example to which the present invention is applied. The present differential pressure sensor is configured by using two pieces of pressure sensor submodules 20 for absolute pressure measurement. It outputs the differential pressure signals that represent the difference between the signals from the two sensors on the circuit board.

Installation of a DPF (Diesel Particulate Filter) is under way in order to reduce particulate matters (PMs) contained in exhaust gas of a diesel engine. There is a need to measure a differential pressure between both the sides of the filter in order to detect the clogging of the filter. In order to measure a differential pressure of exhaust gas, it is necessary to improve the corrosion resistance of the pressure sensitive portion, and thereby protect the pressure sensitive portion from corrosion caused by corrosive components in the exhaust gas.

Figure 4A:
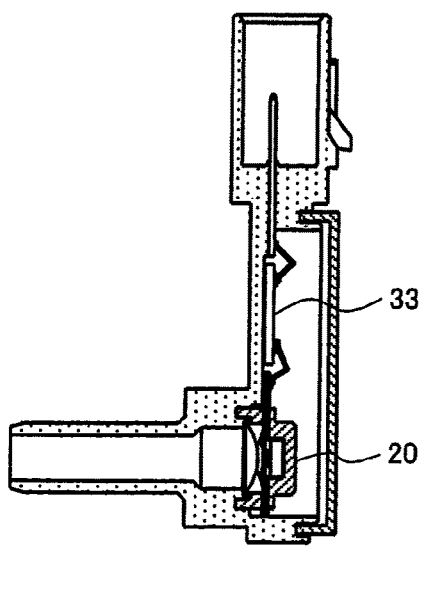
FIG. 4(A) is a sectional side view thereof, FIG. 4(B) a plan view, and FIG. 4(C) a sectional front view.
Figure 4B:
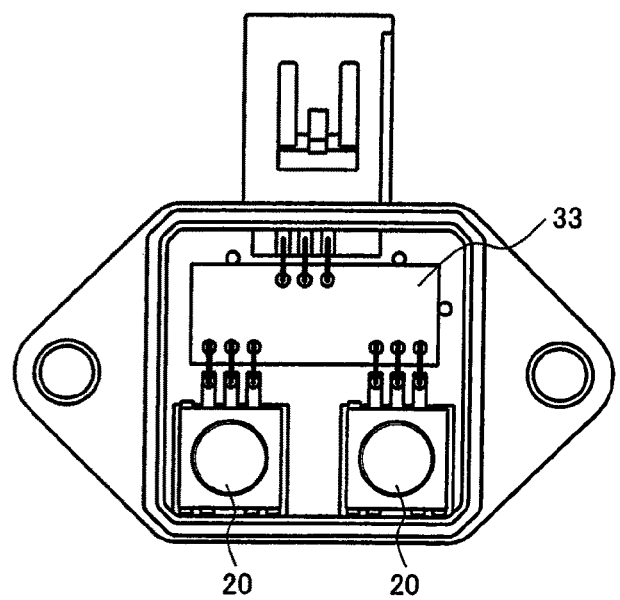

In the present embodiment, as shown in FIGS. 4(A) and 4(B), pressure is measured by using two pieces of pressure sensor submodules 20 comprising gold electrodes, gold wires and gold-plated terminals and measuring absolute pressure, the signals from the pressure sensor submodules 20 are processed on a circuit board 33, and thereby differential pressure signals are output.

Figure 4C:
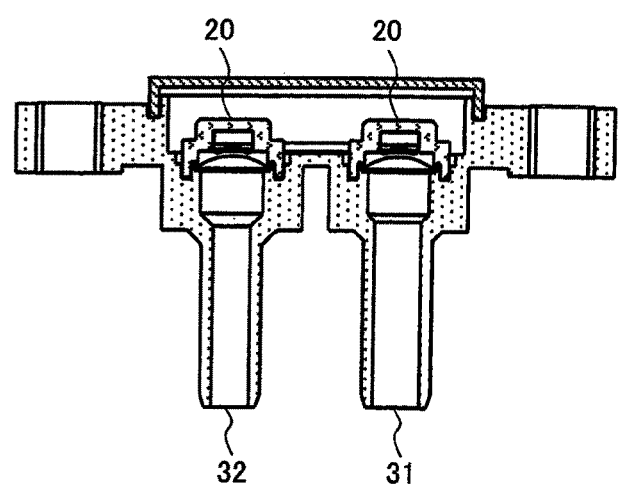

As shown in FIG. 4C, the pressures on both of upstream from and downstream from the filter are introduced into the pressure inlets 31 and 32 of the differential pressure sensor respectively. The pressure sensor submodules 20 mounted in the pressure inlets convert the pressures into electric signals. The pressure signals from the submodules 20 are taken into the substrate 33 and the differential signals are processed from the signals of the pressure sensor submodules 20 and output in a differential pressure signal processing circuit installed on the circuit board.

Second Embodiment

Figure 5:
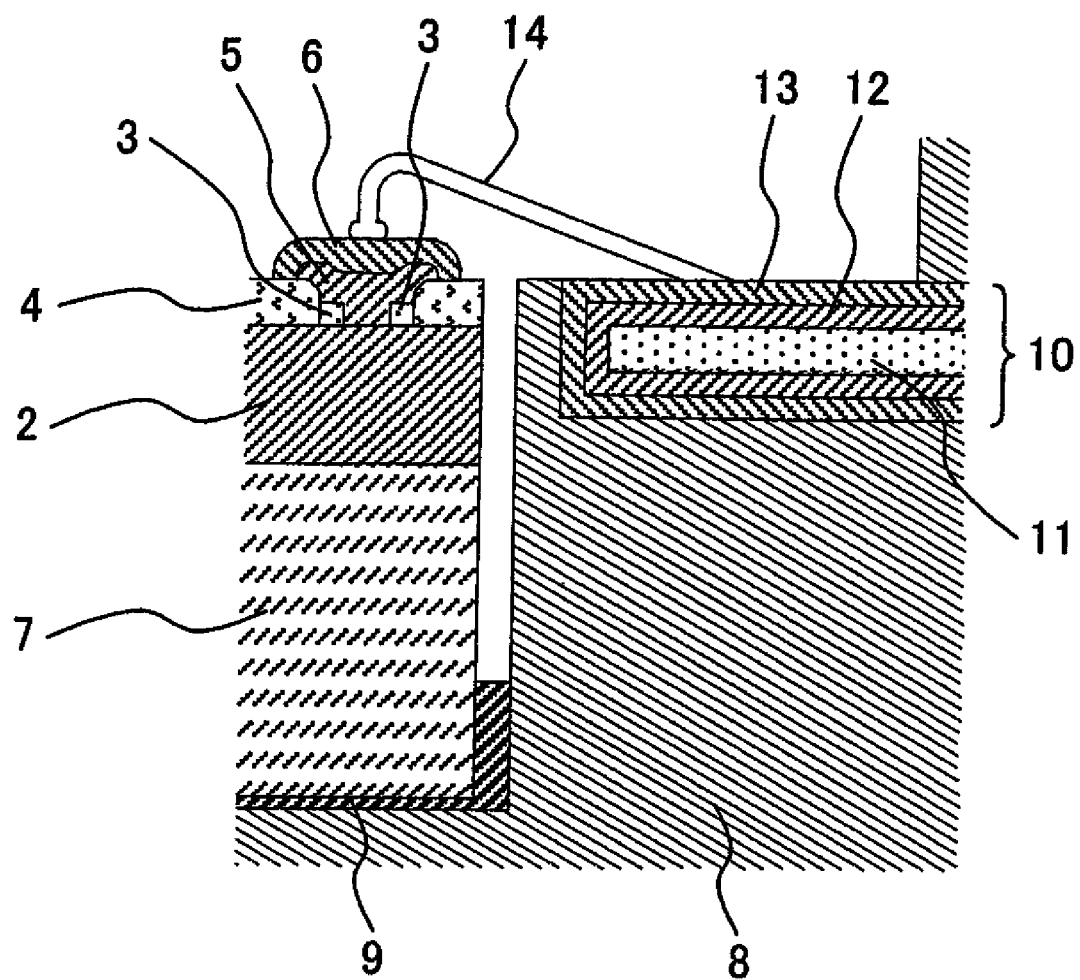
FIG. 5 shows an enlarged sectional view showing a substantial part of a pressure sensor submodule according to a second embodiment.

FIG. 5 is an enlarged sectional view showing a partially modified substantial part of the pressure sensor submodule shown in FIG. 2.

A gold electrode 6 of a sensor chip 2 is electrically connected to the gold-plated layer 13 of a terminal 10 with a gold wire 14 by wire bonding. By using the gold wire 14 for bonding, corrosion resistance against corrosive matters is improved. In order to prevent an adhesion ensuring-diffusion preventative layer 5 from being damaged due to the application of vibration at the bonding with the gold wire 14, parts of an aluminum electrode immediately under the part subjected to the wire bonding are cut out locally. By so doing, a titanium-tungsten layer 5 is prevented from incurring cracks when load and vibration are applied due to the bonding and the gold in the gold electrode 6 is prevented from diffusing into the aluminum electrode 3.

The shape of the aluminum electrode after locally cut may be changed variously besides the case shown in FIG. 5. Further, the aluminum electrode may have a structure wherein the part thereof immediately under the portion bonded beforehand is cut out.

INDUSTRIAL APPLICABILITY

As it is described in the paragraph of Background Art, an aluminum electrode used as an electrode chip of a semiconductor pressure sensor is susceptible to a corrosive environment and a measure against the corrosion is necessary when it is used in a corrosive environment. The present invention proposes a corrosion-resistant structure of a semiconductor pressure sensor used in such a corrosive environment and the practical application thereof is expected.

The invention claimed is:

1. A semiconductor pressure sensor for measuring pressure of an exhaust gas of a combustion engine, the exhaust gas containing corrosive components, wherein:
    the whole area of a semiconductor chip, except for pads for wire bonding and probe pads for characteristic confirmatory check which function as electrical input and output portions, is coated with a corrosion-resistant material such as silicon nitride;
    an adhesion ensuring-diffusion preventative layer is formed on aluminum electrodes at the pads for wire bonding and the probe pads;
    the surface of the adhesion ensuring-diffusion preventative layer is coated with gold;
    the adhesion ensuring-diffusion preventive layer is made of tungsten-titanium;
    the tungsten-titanium layer as the adhesion ensuring-diffusion preventative layer covers over the whole of a top face of each aluminum electrode and spreads across a boundary between the aluminum electrode and the silicon nitride layer as the corrosion-resistant material so as to overhang the silicon nitride layer; and
    the gold coating spreads across a boundary between the adhesion ensuring-diffusion preventative layer of tungsten-titanium and the corrosion-resistant material of silicon nitride.

2. The semiconductor pressure sensor according to claim 1, wherein the adhesion ensuring-diffusion preventative layer has a thickness of about 0.25 μm and is configured so as to overhang the silicon nitride.

3. The semiconductor pressure sensor according to claim 1, wherein:
    said electrical input and output portions of the semiconductor chip are connected to external input and output terminals with gold wires, respectively; and
    the surfaces of the external input and output terminals are coated with gold.

4. The semiconductor pressure sensor according to claim 1, wherein said gold coating is formed by sputtering, plating, or both sputtering and plating.

5. The semiconductor pressure sensor according to claim 4, wherein the thickness of the gold coating is at least 0.5 μm.

6. The semiconductor pressure sensor according to claim 1, wherein the semiconductor chip is bonded to glass with anodic bonding at a temperature not higher than 320° C.

7. The semiconductor pressure sensor according to claim 1, wherein a surface of the adhesion ensuring-diffusion preventative layer is coated with gold after the semiconductor chip is bonded to glass with anodic bonding.

8. The semiconductor pressure sensor according to claim 1, wherein the semiconductor pressure sensor is configured so that parts of aluminum of the lower portions of the aluminum electrodes to which wire bonding is applied may be cut out in order to prevent the adhesion ensuring-diffusion preventative layer from being damaged due to the application of vibration at the gold coating.

9. A semiconductor pressure sensor for measuring pressure in an engine exhaust gas that contains corrosive components, said pressure sensor comprising:
    a semiconductor chip;
    electrical connection pads arrayed on a surface of said semiconductor chip;
    a corrosion resistant layer which covers the entire surface of the semiconductor chip, except for the electrical connection pads;
    aluminum electrodes formed at the electrical connection pads on said semiconductor chip;

an adhesion ensuring-diffusion preventative layer formed on said aluminum electrodes; and a gold coating on the surface of the adhesion ensuring-diffusion preventative layer; wherein, said corrosion resistant layer is formed silicon nitride;

said adhesion ensuring-diffusion preventative layer is formed of tungsten-titanium;

the tungsten-titanium layer as the adhesion ensuring-diffusion preventative layer covers over the whole of a top face of each aluminum electrode and spreads across a boundary between the aluminum electrode and the silicon nitride layer as the corrosion-resistant material so as to overhang the silicon nitride layer; and the gold coating spreads across a boundary between the adhesion ensuring-diffusion preventative layer of tungsten-titanium and the corrosion-resistant layer of silicon nitride.

10. The semiconductor pressure sensor according to claim 1, wherein a thickness of the gold coating formed on the surface of the adhesion ensuring-diffusion preventative layer is thicker than a thickness of the adhesion ensuring-diffusion preventative layer formed on the aluminum electrodes.

11. The semiconductor pressure sensor according to claim 9, wherein a thickness of the gold coating formed on the surface of the adhesion ensuring-diffusion preventative layer is thicker than a thickness of the adhesion ensuring-diffusion preventative layer formed on the aluminum electrodes.

* * * * *